US010622528B2

(12) United States Patent
Oku et al.

(10) Patent No.: US 10,622,528 B2
(45) Date of Patent: Apr. 14, 2020

(54) LIGHT-EMITTING DEVICE

(71) Applicant: NICHIA CORPORATION, Anan-shi, Tokushima (JP)

(72) Inventors: Hironao Oku, Anan (JP); Toshiyuki Hashimoto, Anan (JP); Mitsuhiro Isono, Itano-gun (JP); Takao Ishihara, Oogaki (JP); Takaaki Kato, Takamatsu (JP)

(73) Assignee: NICHIA CORPORATION, Anan-Shi (JP)

( * ) Notice: Subject to any disclaimer, the term of this patent is extended or adjusted under 35 U.S.C. 154(b) by 9 days.

(21) Appl. No.: 15/924,079

(22) Filed: Mar. 16, 2018

(65) Prior Publication Data
US 2018/0269366 A1    Sep. 20, 2018

(30) Foreign Application Priority Data
Mar. 17, 2017   (JP) .................. 2017-053208

(51) Int. Cl.
| H01L 33/48 | (2010.01) |
| H01L 23/60 | (2006.01) |
| H01L 33/62 | (2010.01) |
| H01L 25/16 | (2006.01) |
| H01L 33/60 | (2010.01) |

(Continued)

(52) U.S. Cl.
CPC ............. *H01L 33/60* (2013.01); *H01L 23/60* (2013.01); *H01L 29/866* (2013.01); *H01L 33/486* (2013.01); *H01L 33/645* (2013.01); H01L 25/167 (2013.01); H01L 33/62 (2013.01); H01L 2933/0033 (2013.01)

(58) Field of Classification Search
CPC ..... H01L 23/60; H01L 25/167; H01L 29/866; H01L 33/486; H01L 33/50; H01L 33/62; H01L 33/645
USPC .................................................. 257/98–103
See application file for complete search history.

(56) References Cited

U.S. PATENT DOCUMENTS

| 8,455,915 B2 | 6/2013 | Hayashi |
| 2004/0051171 A1 | 3/2004 | Ng et al. |

(Continued)

FOREIGN PATENT DOCUMENTS

| JP | 2000-012911 A | 1/2000 |
| JP | 2004-111964 A | 4/2004 |

(Continued)

*Primary Examiner* — Ori Nadav
*Assistant Examiner* — Vernon P Webb
(74) *Attorney, Agent, or Firm* — Foley & Lardner LLP

(57) ABSTRACT

A light-emitting device includes: a resin package including: a lead part including a first lead and a second lead, each including a main body portion and a raised portion connected to the main body portion, wherein an upper surface of each of the first lead and the second lead includes a first primary surface portion in the main body portion and a curved portion in the raised portion in a cross-sectional view taken in a direction perpendicular to an upper surface of the lead part, and wherein the curved portion is continuous with and curved upward from an end portion of the first primary surface portion, a resin portion, and a recess defined by a portion of the upper surface of the lead part and the resin portion; and a light-emitting element mounted in the resin package. The curved portion is buried in the resin portion.

7 Claims, 5 Drawing Sheets

(51) Int. Cl.
  *H01L 29/866* (2006.01)
  *H01L 33/64* (2010.01)

(56) References Cited

U.S. PATENT DOCUMENTS

2010/0133560 A1\* 6/2010 Kim .................. H01L 33/486
                                                    257/89
2016/0013378 A1   1/2016 Sakamoto et al.

FOREIGN PATENT DOCUMENTS

| JP | 2012-089547 A | 5/2012 |
| JP | 2014-099496 A | 5/2014 |
| JP | 2016-021446 A | 2/2016 |

\* cited by examiner

LIGHT-EMITTING DEVICE

CROSS-REFERENCE TO RELATED APPLICATION

This application claims priority to Japanese Patent Application No. 2017-053208, filed on Mar. 17, 2017, the contents of which are hereby incorporated by reference in their entirety.

BACKGROUND

The present disclosure relates to a light-emitting device.

Light-emitting devices using light-emitting elements such as light-emitting diodes are widely used as various light sources of lighting apparatuses and the like. Such light-emitting devices can be obtained by, for example, forming a light-emitting device substrate including a plurality of light-emitting elements mounted on a resin-covered lead frame, and then cutting the light-emitting device substrate to singulate into individual light emitting devices.

In order to facilitate the cutting of the lead frame in such a light-emitting device substrate by reducing the friction of the dicer blade at the time of singulation, there is a lead frame that is subjected to a pressing process at portions of the lead frame to be cut (e.g., Japanese Patent Publication No. 2012-89547).

SUMMARY

In the light-emitting device described in Japanese Patent Publication No. 2012-89547, a corner portion may be formed in the upper end portion of the lead having been subjected to a pressing process, and a crack may be generated in a resin portion in the vicinity of the corner portion.

In view of this, certain embodiments of the present embodiment provides a light-emitting device in which cracking of the resin portion is inhibited.

A light-emitting device according to one embodiment of the present disclosure includes a resin package and a light emitting element mounted in the resin package. The resin package includes a lead part including a first lead and a second lead, each of the first lead and the second lead including a main body portion and at least one raised portion connected to the main body portion, an upper surface of each of the first lead and the second lead including a first primary surface portion in the main body portion and a curved portion in the at least one raised portion in a cross-sectional view taken in a direction perpendicular to the upper surface of the lead part, the curved portion continuous with an end portion of the first primary surface portion and is curved upward from the end portion of the first primary surface portion, a resin portion, and a recess defined by a portion of an upper surface of the lead part and the resin portion. A part of the first primary surface portion is located at a bottom of the recess. The light-emitting element is placed on the first primary surface portion in the recess. The curved portion is buried in the resin portion.

According to certain embodiments of the present embodiment, it is possible to provide a light-emitting device with which cracking of the resin portion is inhibited.

DETAILED DESCRIPTION

Figure 1A:
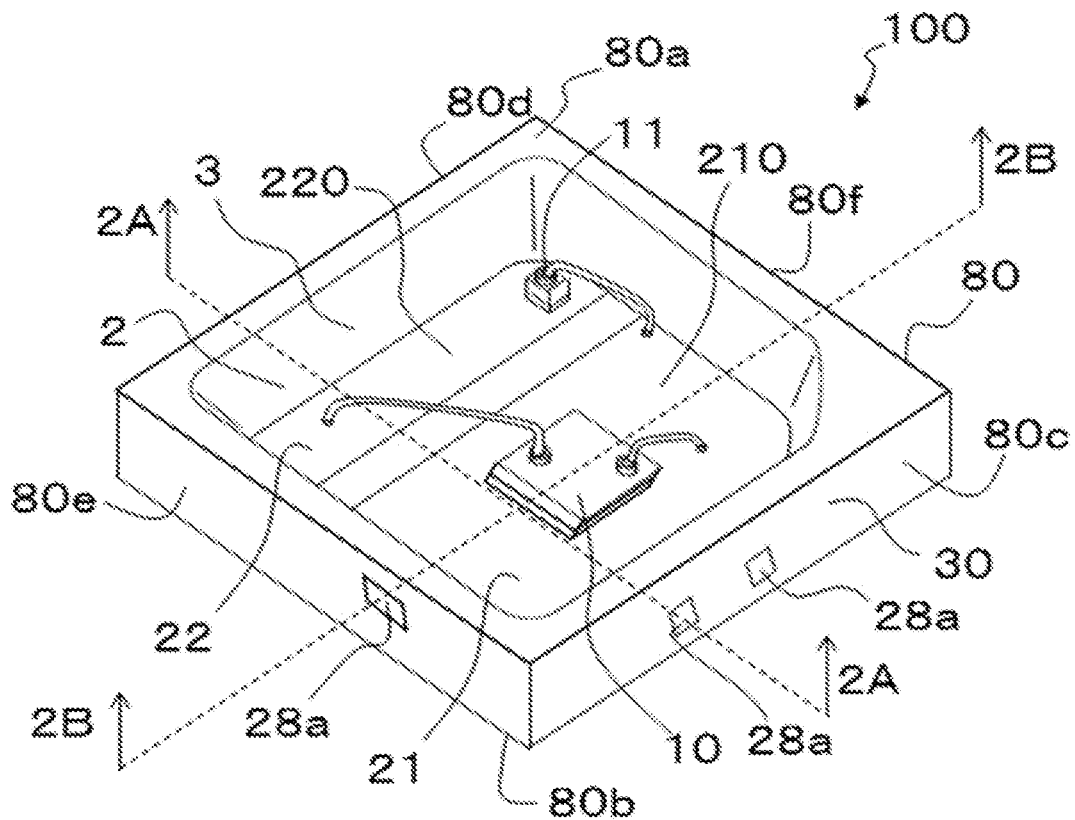
FIG. 1A is a schematic perspective view showing a light-emitting device according to one embodiment of the present disclosure, as seen from the upper surface side.

Embodiments will be described in detail below with reference to the drawings. Portions or members with the same reference numerals in different figures represents the same or similar portions or members.

Moreover, the description below is intended to illustrate a light-emitting device to give a concrete form to the technical ideas of the present disclosure, but the present invention is not intended to be limited to the description below. The size, material, shape, relative arrangement, etc., of the components in the description below are intended to be illustrative, but the scope of the present invention is not limited thereto, unless otherwise specified. The size, relative arrangement, etc., of the members shown in each figure may be exaggerated in order to facilitate the understanding.

In the present specification and in the figures, a first direction refers to a lateral direction including both a rightward direction and a leftward direction. The second direction refers to upward-downward direction including both of the upward direction and the downward direction.

In the embodiments to be described below, the terms "unit" and "resin-covered lead frame" may be used both before and after the provision of light-emitting elements, wires, etc. Also, the same terms, such as "resin portion" and "depression", may be used both before and after the separation process.

Light-Emitting Device 100

Figure 1B:
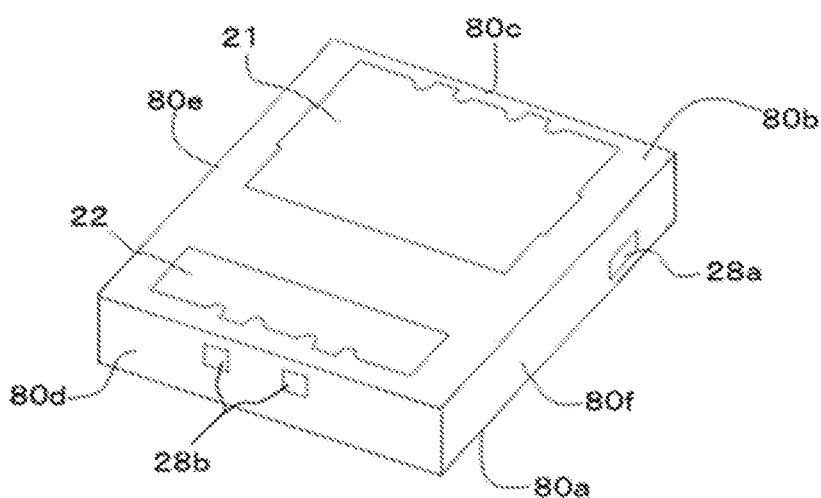
FIG. 1B is a schematic perspective view showing a light-emitting device according to an embodiment of the present disclosure, as seen from the lower surface side.
Figure 2A:
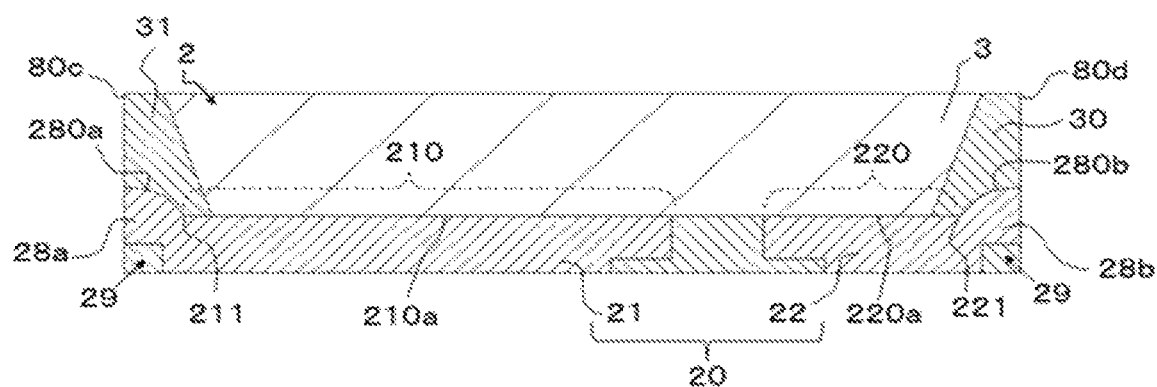
FIG. 2A is a schematic end view taken along line 2A-2A of FIG. 1A.
Figure 2B:
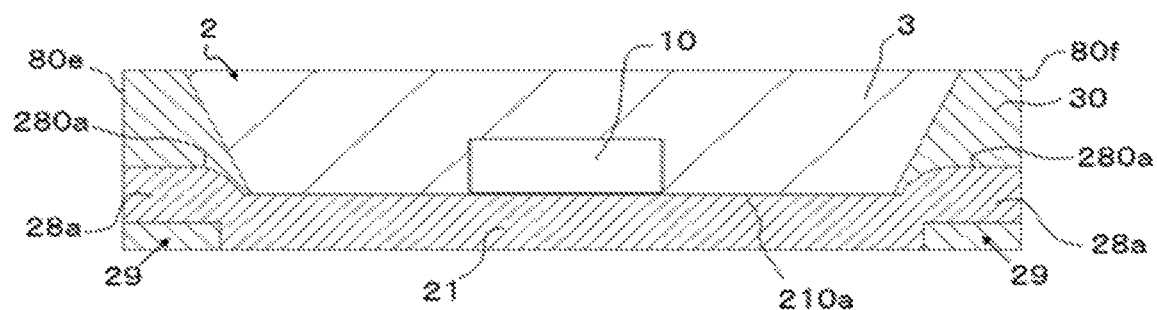
FIG. 2B is a schematic end view taken along line 2B-2B of FIG. 1A.

FIG. 1A is a Schematic Perspective View Showing a Light-Emitting Device 100 of the present disclosure when viewed from an upper surface side, and FIG. 1B is a schematic perspective view showing the light-emitting device 100 of the present disclosure when viewed from a lower surface side. FIG. 2A is a schematic end view taken along line 2A-2A of FIG. 1A, and FIG. 2B is a schematic end view taken along line 2B-2B of FIG. 1A. Wires, etc., are not shown in the end views. The light-emitting device 100 includes a resin package 80, and a light-emitting element 10 mounted on the resin package 80. The resin package 80 includes a recess 2 defined by a part of the upper surface of a lead part 20 and a resin portion 30. The light-emitting device 100 may further include a sealing member 3.

Resin Package 80

The resin package 80 includes the lead part 20 including a first lead 21 and a second lead 22, and the resin portion 30 molded integrally with the lead part 20. The first lead 21 includes a main body portion 210, and at least one raised portion 28a connected to the main body portion 210. The second lead 22 includes a main body portion 220, and at least one raised portion 28b connected to the main body portion 220.

The resin package 80 is a housing and includes the recess 2. A portion of the upper surface of the first lead 21 and a portion of the upper surface of the second lead 22 are located at the bottom of the recess 2, and the light-emitting element 10 is mounted in the recess 2. The resin package 80 has an upper surface 80a, and a lower surface 80b opposite to the upper surface 80a. The resin package 80 has a substantially rectangular outer shape when viewed from above. Therefore, the resin package 80 has four outer lateral surfaces, i.e., a first outer lateral surface 80c, a second outer lateral surface 80d opposite to (i.e., opposing) the first outer lateral surface 80c, a third outer lateral surface 80e, and a fourth outer lateral surface 80f located opposite to (i.e., opposing) the third outer lateral surface 80e. In the resin package 80 shown in FIG. 2A and FIG. 2B, the raised portion 28a of the first lead 21 is exposed from the resin portion 30 at the first outer lateral surface 80c, the third outer lateral surface 80e, and the fourth outer lateral surface 80f, and the raised portion 28a and the resin portion 30 are substantially in the same plane. At the second outer lateral surface 80d, the raised portion 28b of the second lead 22 is exposed from the resin portion 30, and the raised portion 28b and the resin portion 30 are substantially in the same plane.

As shown in FIGS. 2A and 2B, the upper surface of the first lead 21 includes a first primary surface portion 210a in the main body portion 210, and a curved portion 280a in the raised portion 28a. The curved portion 280a is continuous with an end portion 211 of the first primary surface portion 210a, and is curved upwardly from the end portion 211. That is, the curved portion 280a extends from the end portion 211 of the first primary surface portion 210a to the first outer lateral surface 80c of the resin package 80 and curved toward the upper surface side.

Similarly, the upper surface of the second lead 22 includes a first primary surface portion 220a in the main body portion 220, and a curved portion 280b in the raised portion 28b. The curved portion 280b is continuous with an end portion 221 of the first primary surface portion 220a, and is curved upwardly from the end portion 221. That is, the curved portion 280b extends from the end portion 221 of the first primary surface portion 220a to the second outer lateral surface 80d of the resin package 80, and is curved toward the upper surface side.

A part of the first primary surface portion 210a, 220a is located at the bottom of the recess 2. The light-emitting element 10 is placed on the first primary surface portion 210a in the recess 2. In the present embodiment, an example is shown in which a single light-emitting element 10 is placed only on the first lead 21 in the light-emitting device 100. In the light-emitting device 100, any other appropriate arrangement of the light-emitting element 10 may be employed.

For example, a light-emitting element 10 may be disposed over the first lead 21 and the second lead 22, or at least one light-emitting element 10 may be placed on each of the first lead 21 and the second lead 22.

The curved portion 280a, 280b is buried in the resin portion 30. Specifically, the curved portion 280a, 280b is located in a side wall portion 31 of the recess 2, and the curved portion 280a, 280b is not exposed from the resin portion 30 within the recess 2. An upper surface of the curved portion 280a, 280b has no sharp corner portion, which allows for reducing the possibility that a crack may be generated in the resin portion 30 in the vicinity of the curved portion 280a, 280b. Therefore, it is possible to reduce the possibility of the strength of the light-emitting device 100 becomes insufficient, or that light emitted from the light-emitting element 10 is not efficiently reflected by the resin portion 30. Further the curved portion 280a, 280b has no corner portion but is curved, so that the inner lateral surfaces of the recess 2 can be located closer to the curved portion 280a, 280b, and the inner lateral surfaces can be more inclined toward the curved portion 280a, 280b. This allows for, for example, increasing the area of the bottom of the recess 2, so that it is possible to use a larger light-emitting element, and light from the light-emitting element can be efficiently reflected upward at the inner lateral surfaces of the recess 2. The curved portion 280a, 280b is not exposed from the resin portion 30 within the recess 2, so that light from the light-emitting element 10 can be reflected efficiently by the resin portion 30 having a high optical reflectance.

The curved portion 280a is curved upwardly from the end portion 211 of the first primary surface portion 210a, so that a part of the curved portion 280a is located within the side wall portion 31 at a higher position than the position of the first primary surface portion 210a. A depression 29 is formed at the lower surface on the opposite side to the curved portion 280a, and a part of the resin portion 30 is arranged in the depression 29. The curved portion 280b and the depression 29 formed in the second lead 22 are similar to the curved portion 280a and the depression 29 provided on the first lead 21. With the curved portion 280a, 280b and the dented portion 29, it is possible to improve adhesion between the resin portion 30 and the lead part 20. The curved portion 280a, 280b and the depression 29 are formed at the same time by performing a pressing process in which the lead frame 20A in a state before the formation of the resin portion 30 is subject to a pressing at a portion that corresponds to the edge of the lead part 20 from the lower side toward the upper side.

Figure 3A:
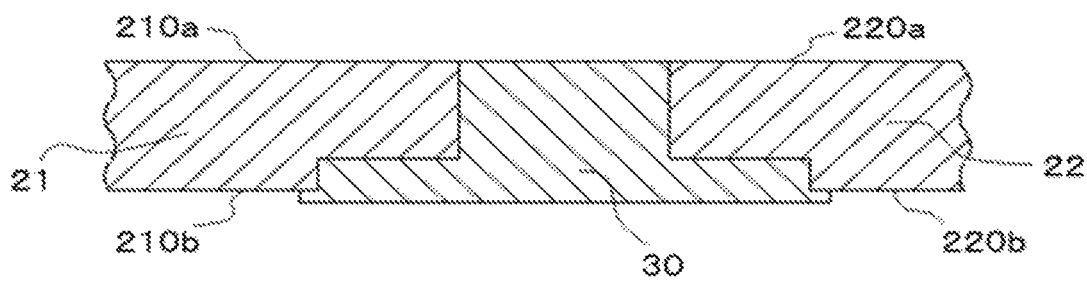
FIG. 3A is a schematic cross-sectional view showing another configuration of a resin package.
Figure 3B:
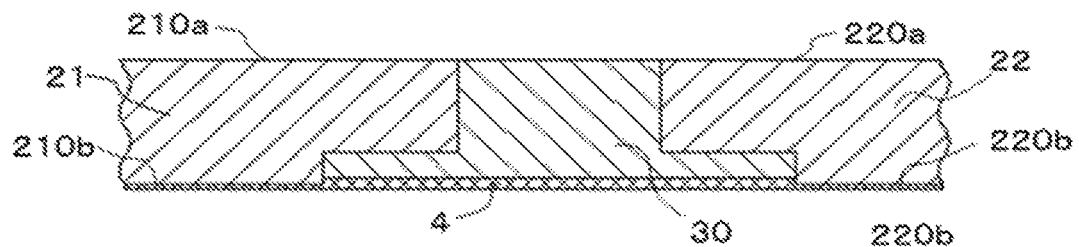
FIG. 3B is a schematic cross-sectional view showing another configuration of a resin package.

In the resin package 80 according to the present embodiment, the first primary surface portion 210a of the first lead 21 and the first primary surface portion 220a of the second lead 22 are arranged so as to be substantially in the same plane with each other. A second primary surface portion 210b of the first lead 21 opposite to the first primary surface portion 210a and a second primary surface portion 220b of the second lead 22 opposite to the first primary surface portion 220a are arranged so as to be substantially in the same plane with each other. Moreover, at the lower surface of the resin package 80, at least a part of the second primary surface portion 210b of the first lead 21 and at least a part of the second primary surface portion 220b of the second lead 22 are arranged so as to be exposed from the resin portion 30 and to be substantially in the same plane with the lower surface of the resin portion 30. Thus, heat generated from the light-emitting element 10 can be efficiently dissipated downward from the lead part 20. At the lower surface of the resin package 80, the lower surface of the resin portion 30 may be located at a position higher than a position of the second primary surface portion 210b of the first lead 21 and a position of the second primary surface portion 220b of the second lead 22 as shown in FIG. 3A, or may be located at a position lower than a position of the second primary surface portion 210b of the first lead 21 and a position of the second primary surface portion 220b of the second lead 22 as shown in FIG. 3B. At the lower surface of the resin package 80, in the case in which the lower surface of the resin portion 30 is located at a lower position than the position of the second primary surface portion 210b of the first lead 21 and the second primary surface portion 220b of the second lead 22, a part of the resin portion 30 covers the lower peripheral portion of the second primary surface portion 210b of the first lead 21 and the second primary surface portion 220b of the second lead 22, for example. At the lower surface of the resin package 80, in the case in which the lower surface of the resin portion 30 is located at a higher position than the second primary surface portion 210b of the first lead 21 and the second primary surface portion 220b of the second lead 22, the height difference between the lower surface of the resin portion 30 and the second primary surface portion of each of the first lead 21 and the second lead 22 is generated due to a step generated by a resin sheet 4 to be disposed on the second primary surface portion 210b of the first lead 21 and the second primary surface portion 220b of the second lead 22 at the time of forming the resin portion 30 on the lead part 20 using dies, or the like, for example.

The resin package 80 shown in FIG. 1A is an example in which the height of the raised portion 28a exposed at the first outer lateral surface 80c and the height of the raised portion 28b exposed at the third outer lateral surface 80e are different from each other. With this difference in height, the effect of effectively controlling the shape of warp occurring when the lead part 20 expands/contracts due to, for example, heat can be obtained. Similarly, a height of the raised portion 28b exposed at the second outer lateral surface 80d and a height of the raised portion 28a exposed at the fourth outer lateral surface 80f may be different. Alternatively, the raised portions 28a and 28b may have the same height.

In the resin package 80, a plurality of raised portions 28 may be exposed on one outer lateral surface. With the resin package 80 shown in FIG. 1A, two raised portions 28a are exposed at the first outer lateral surface 80c. With a plurality of raised portions 28 disposed on a single outer lateral surface improves the adhesion between the resin portion 30 and the lead part 20. With a plurality of narrow raised portions, the stress to be applied in the vicinity of the raised portion during the cutting in the singulation to be described below can be reduced than the case of having providing a single wide raised portion 28.

A width of the raised portion 28 exposed at one outer lateral surface in the direction along the outer lateral surface may be the same as or different from a width of the raised portion 28 exposed at another outer lateral surface in the direction along the other outer lateral surface. The light-emitting device 100 shown in FIG. 1A is an example in which a width of one raised portion 28a exposed at the first outer lateral surface 80c in a direction along the first outer lateral surface 80c is smaller than a width of the raised portion 28a exposed at the third outer lateral surface 80e in a direction along the third outer lateral surface 80e. The total of the widths of two raised portions 28a exposed at the first outer lateral surface 80c in the direction along the first outer lateral surface is greater than the width of the raised portion 28a exposed at the third outer lateral surface 80e in the direction along the third outer lateral surface 80e. Two raised portions 28a located at the first outer lateral surface 80c are preferably arranged so as to be symmetric with respect to the center of the lateral surface of the first lead 21 located at a first outer lateral surface 80c side.

Note that the outer shape of the resin package 80 when viewed from above may be any shape as well as a rectangular shape as shown in FIG. 1A. The opening of the recess of the resin package 80 may have a rectangular shape, a circular shape, an elliptical shape, an oval shape, or the like. Moreover, the opening of the recess may be a modified shape of any of the shapes described above, e.g., a recess having a rectangular-shaped opening having a chamfered corner portion when viewed from above, as shown in FIG. 1A. With such a shape, a portion of the opening may serve as a mark indicating the polarity of the lead, e.g., an anode mark or a cathode mark.

The lead portion 20 or the lead frame 20A to be described below preferably includes a base member such as copper, and a metal layer covering the base member. The base member contains a metal such as copper, aluminum, gold, silver, iron, nickel, an alloy of two or more of these, phosphor bronze, or iron-containing copper, for example. These materials may be used as a single layer or a layered structure (e.g., a clad material). Particularly, the base member is preferably copper, which is inexpensive and highly heat-dissipative. Examples of the metal layer include a single layer or a multi-layer structure of silver, aluminum, nickel, palladium, rhodium, gold, copper, or an alloy of two or more of these. The lead part 20 may have an area where a metal layer is absent. The metal layer disposed at the upper surface of the lead part 20 may be different from the metal layer disposed at the lower surface of the lead part 20. For example, the metal layer disposed at the upper surface may be a multi-layer metal layer including a metal layer of nickel, and the metal layer disposed at the lower surface may be a metal layer not including a metal layer of nickel. A thickness of the metal layer disposed at the upper surface of the lead part 20 is preferably greater than the thickness of the metal layer disposed at the lower surface of the lead part 20. With such a thickness, light emitted from the light-emitting element 10 can be efficiently reflected by the metal layer at the upper surface side, and a thickness of the metal layer at the lower surface side can be reduced in order to reduce the cost. In the case in which the thickness of the metal layer on the upper surface of the lead part 20 and the thickness of the metal layer on the lower surface of the lead part 20 are different from each other, the metal layer at the upper surface and the metal layer at the lower surface have the same number of the layers while thicknesses of some or all of the layers are different between the metal layer at the upper surface and the metal layer at the lower surface, so that the overall thicknesses may be different between the metal layer at the upper surface and the metal layer at the lower surface. Alternatively, the number of layers at the upper surface of the lead part 20 and the number of layers at the lower surface of the lead part 20 may be different from each other, so that the overall thickness of the metal layer at the upper surface of the lead part 20 and that of the metal layer on the lower surface of the lead part 20 may be different from each other.

When a plating layer of silver or a silver alloy is formed at the uppermost surface of the lead part 20, a protective layer of silicon oxide, or the like, is preferably provided on a surface of the plating layer of silver or a silver alloy. With this arrangement, it is possible to prevent the plating layer of silver or a silver alloy from being discolored due to a sulfur component in the air. For a method of forming the protective layer, for example, a vacuum process such as sputtering or atomic layer deposition, or may be any other method known in the art can be used.

Resin Portion 30

The Resin Portion 30 is a Member of the Resin Package 80 and is Molded Integrally with the lead part 20. The resin portion 30 has inner lateral surfaces defining the recess 2 of the resin package 80, and the inner lateral surfaces upwardly reflects light emitted from the light-emitting element 10, so that efficient light extraction can be realized.

A resin material of a matrix of the resin portion 30 may be a thermosetting resin, a thermoplastic resin, or the like. More specifically, examples of the resin material include a modified epoxy resin composition such as an epoxy resin composition, a silicone resin composition, a silicone-modified epoxy resin, a modified silicone resin composition such as an epoxy-modified silicone resin, a hardened material of an unsaturated polyester resin, a saturated polyester resin, a polyimide resin composition, a modified polyimide resin composition, or the like, or a resin such as polyphthalamide (PPA), a polycarbonate resin, polyphenylene sulfide (PPS), liquid crystal polymer (LCP), an ABS resin, a phenol resin, an acrylic resin and a PBT resin. In particular, a thermosetting resin of an epoxy resin composition, a silicone resin composition or a modified silicone resin composition is preferably used.

The resin portion 30 preferably further contains a light-reflecting substance. Examples of the light-reflecting substance include titanium oxide, silicon oxide, zirconium oxide, potassium titanate, aluminum oxide, zinc oxide, aluminum nitride, boron nitride, and mullite. The resin portion 30 containing the light-reflecting substance allows for efficiently reflecting light emitted from the light-emitting element 10. For example, in the case in which titanium oxide is used, titanium oxide is included preferably at an amount of 20 wt % or more and 60 wt % or less, more preferably 25 wt % or more and 55 wt % or less, with respect to the total weight of the resin portion 30. The resin portion 30 preferably has a reflectance of 60% or more, more preferably 90% or more, of light from the light-emitting element 10.

In order to improve the contrast of the light-emitting device, the resin portion 30 may have a low optical reflectance with respect to external light around the light-emitting device (e.g., sunlight in many cases). In this case, normally, the resin portion 30 is preferably black or a near-black color. In this case, carbon such as acetylene black, activated carbon or graphite, transition metal oxide such as iron oxide, manganese dioxide, cobalt oxide or molybdenum oxide, or a colored organic pigment, etc., can be used for the filler, in accordance with the purpose.

Light-Emitting Element 10

A light-emitting element 10 is placed on the bottom of the recess 2 of the resin package 80. For the light-emitting element 10, a semiconductor light-emitting element such as a light-emitting diode element can be used. In particular, the light-emitting element 10 preferably includes a nitride semiconductor ($In_xAl_yGa_{1-x-y}N$, 0≤x, 0≤y, x+y≤1) configured to emit light in the ultraviolet to visible range. One or two or more light-emitting elements 10 may be placed on a single recess. In the case in which two light-emitting elements are placed on a single recess 2, the two light-emitting elements may be a light-emitting element emitting blue color light and a light-emitting element emitting green color light. In the case in which three light-emitting elements are placed on one recess 2, the three light-emitting elements may be a light-emitting element emitting blue color light, a light-emitting element emitting green color light and a light-emitting element emitting red color light. In the case in which two or more light-emitting elements 10 are used, the light-emitting elements are connected together in a series connection, a parallel connection, or a combination thereof. The light-emitting element 10 may be placed either such that an electrode-forming surface of the light-emitting element faces upward (i.e., face-up mounting) or such that the electrode-forming surface of the light-emitting element faces downward (i.e., flip-chip mounting).

The light-emitting element 10 is placed on the main body portion of the lead part 20 via a bonding member therebetween. Examples of the bonding member include resins including the resin materials described as examples of a material of the resin portion 30, a solder such as a tin-bismuth-based solder, a tin-copper-based solder, a tin-silver-based solder and a gold-tin-based solder, a conductive paste of silver, gold, palladium, or the like, a brazing material such as a bump, an anisotropic conductive material and a low melting point metal, etc.

Protective Element 11

A protective element 11 may be disposed on the bottom of the recess 2 of the resin package 80. The protective element 11 is an element for protecting the light-emitting element from static electricity or high-voltage surge. Specifically, examples of the protective element 11 include a Zener diode. In order to prevent light emitted from the light-emitting element 10 from being absorbed by the protective element 11, the protective element 11 may be coated with a light-reflecting member such as a white resin. The protective element 11 and the light-emitting element 10 are electrically connected to each other in parallel connection.

Sealing Member 3

After the light-emitting element 10, or the like, is placed, a sealing member 3 may be arranged in the recess 2 of the resin package 80. The sealing member 3 covers the light-emitting element 10, etc., on the bottom of the recess 2, and can protect the light-emitting element 10, etc., from external force, dust, moisture, etc.

The sealing member 3 preferably transmit 60% or more, more preferably 90% or more, of the light emitted from the light-emitting element 10. For a material of the sealing member 3, a resin material used for the resin portion 30 can be used, and a thermosetting resin, a thermoplastic resin, or the like, may be used for a resin to be a base material, e.g., a silicone resin, an epoxy resin, an acrylic resin or a resin containing at least one of these may be used for the base material. The sealing member 3 may be a single layer or may have a plurality of layers. Light scattering particles such as titanium oxide, silicon oxide, zirconium oxide or aluminum oxide may be dispersed in the sealing member 3.

The sealing member 3 may contain a material (a phosphor, or the like) adapted to convert the wavelength of light emitted from the light-emitting element 10. Specific examples of a phosphor include cerium-activated yttrium aluminum garnet, cerium-activated lutetium aluminum garnet, europium- and/or chromium-activated nitrogen-containing alumino-calcium silicate (calcium may be partly substituted with strontium), europium-activated SiALON, europium-activated silicate, europium-activated strontium aluminate, and manganese-activated potassium fluorosilicate.

The content of light-scattering particles and/or a phosphor is preferably about 10 to 100 wt % with respect to the total weight of the sealing member 3, for example.

Method of Manufacturing Light-Emitting Device 100

One embodiment of a method of manufacturing the light-emitting device 100 according to the present disclosure will be described.

Figure 4A:
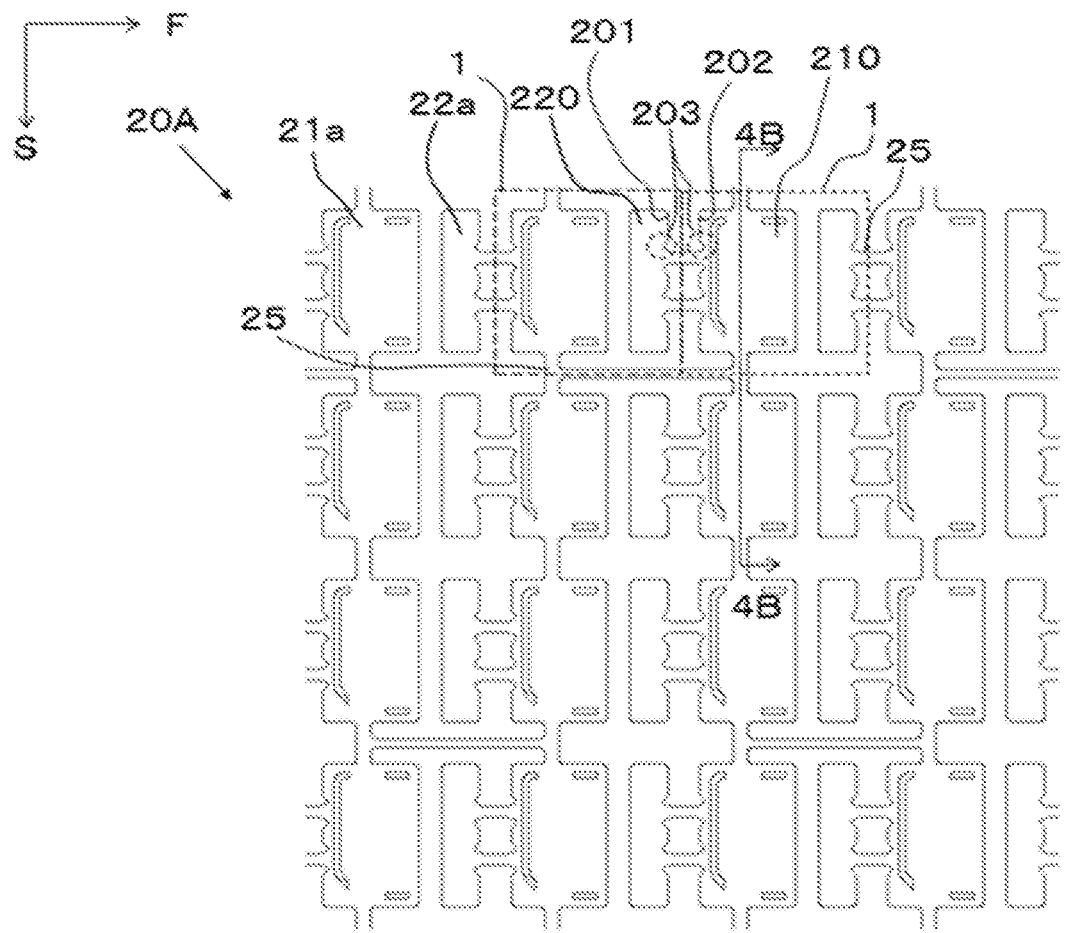
FIG. 4A is a schematic top view showing a lead frame used in a method of manufacturing a light-emitting device according to one embodiment of the present disclosure.

The lead frame 20A shown in FIG. 4A is provided. The lead frame 20A includes a plurality of units 1 each including a portion to be the first lead 21 (hereinafter referred to as a "first lead portion 21a") and a portion to be the second lead 22 (referred to as a "second lead portion 22a"), and a plurality of connecting portions 25. The units 1 are arranged in the first direction F and in the second direction S. Each of the connecting portions 25 connects a respective one of the units 1 with adjacent one of the units 1.

Figure 4B:
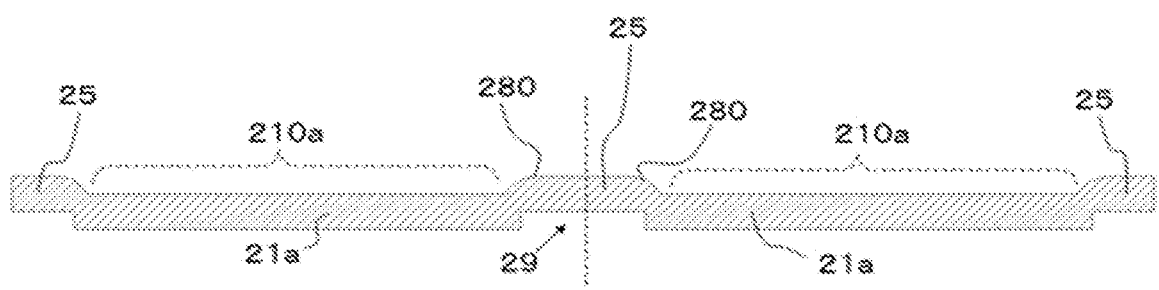
FIG. 4B is a schematic end view taken along line 4B-4B of FIG. 4A.

Next, the connecting portions 25 are subjected to a pressing process in which a part of the lower surface of each of the connecting portions 25 is pressed from the lower surface side toward the upper surface side. Note that a space is defined above each portion to be subjected to a pressing process so that no corner is formed in the upper end part of the portion subjected to the pressing process. Thus, as shown in FIG. 4B, a curved portion 280 and the depression 29 are formed in each unit 1. FIG. 4B is a schematic end view taken along line 4B-4B of FIG. 4A. More specifically, by the pressing processing, a portion of the connected portion 25 is depressed from a lower surface side toward an upper surface side (i.e., the depression 29 is formed) to be raised toward the upper surface side at a volume of a part of the depressed portion, so that the curved portion 280 and the raised portion 28 corresponding to the curved portion 280 are formed.

In the lead frame 20A shown in FIG. 4A, the main body portions 210 and 220 in the vicinity of the connecting portion 25 extending in the first direction F define recesses (notches 203) that are recessed inwardly on lateral surfaces 201 and 202 of the first lead portion 21a and the second lead portion 22a, respectively. More specifically, at the lateral surface 201 of the main body portion 210, one notch 203 is defined on each side of each of the connecting portions 25. Also, at the lateral surface 202 of the main body portion 220, one notch 203 is defined on each side of each of the connecting portions 25. With the notch portions 203 in the main body portion 210, 220 in the vicinity of the connecting portions 25, it is possible to ensure a sufficient length of the connecting portion 25 in the first direction F. Thus, in the connecting portion 25, a wide area can be secured where pressing process can be performed, and it is possible to increase the size of raised portions 28 and depressions 29. Accordingly, it is possible to improve the adhesion between the lead frame 20A and the resin portion 30. With the notches 203 defined by each of the lateral surfaces 201, 202, the surface area to be in contact with the resin portion 30 increases, so that the adhesion between the lead frame 20A and the resin portion 30 can be improved.

Next, the resin portion 30 is molded integrally with the lead frame 20A having been subjected to the pressing process. The resin portion 30 is disposed so as to enclose each curved portion 280 and so that a part of the resin portion 30 is disposed in each depression 29. With the lead frame 20A having the curved portion 280 and the depression 29, the adhesion between the lead frame 20A and the resin portion 30 can be improved. The height difference between the highest position of the curved portion 280 and the first primary surface portion 210a is preferably 35% to 60% with respect to the thickness of the lead frame 20A. With such a difference in height, it is possible to prevent generation of the crack in the resin portion 30 and the breakage of the connecting portion, etc., in the step of singulating. Moreover, it is possible to improve the adhesion with the resin portion 30 while maintaining the strength of the lead frame 20A.

Figure 5:
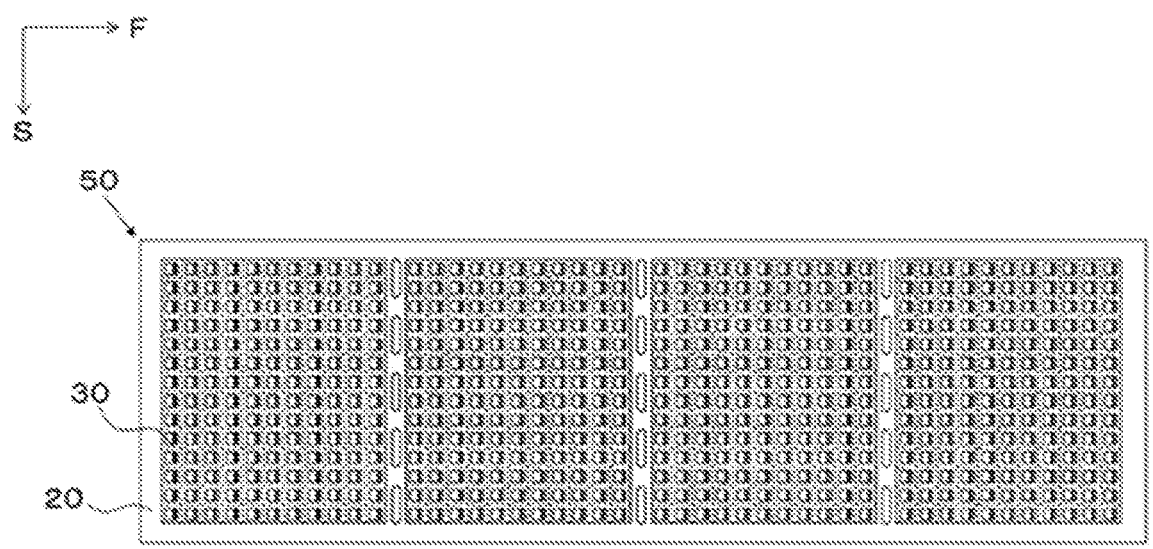
FIG. 5 is a schematic top view showing a resin-covered lead frame used in a method of manufacturing a light-emitting device according to one embodiment of the present disclosure.

FIG. 5 shows the lead frame 20A molded integrally with the resin portion 30 (hereinafter may be referred to as a "resin-covered lead frame 50"). The resin-covered lead frame 50 includes a plurality of recesses 2 at an upper side thereof, and the first lead portion 21a and the second lead portion 22a are both located at the bottom of each recess 2.

Then, the light-emitting element 10 and the sealing member 3 are arranged in the recess 2, so that a light-emitting device array is formed.

Next, the light-emitting device array is separated into a plurality of light-emitting devices 100. At the time of separating the light-emitting device array, the resin portion 30 and the lead frame 20A are simultaneously cut through the depressions 29 of the connecting portions 25. Thus, parts of the connecting portions 25 are arranged at the outer lateral surfaces of each light-emitting device 100.

Examples of the method of separating the light-emitting device array includes various methods such as cutting using a lead cutting mold, cutting by a dicing saw, and cutting by laser light.

In the light-emitting device of the present disclosure, the surface of the curved portion does not have sharp corners, so that it is possible to reduce the possibility of generation of a crack in a part of the resin portion in the vicinity of the curved portion may crack. Therefore, it is possible to reduce the possibility that the strength of the light-emitting device is insufficient, or that light emitted from the light-emitting element is not efficiently reflected by the resin portion.

Further, with the curved portion that does not have corner portion but is curved, the inner lateral surfaces defining the recess can be located closer to the curved portion, or the inner lateral surfaces can be more inclined toward the curved portion. Therefore, for example, the area of the bottom of the recess can be increased, for example, it is possible to use a light-emitting element of a large size, or light emitted from the light-emitting element can be efficiently reflected upward at the inner lateral surface of the recess. Further, with the curved portion not exposed from the resin portion in the recess, light emitted from the light-emitting element can be reflected efficiently by the inner lateral surface of the recess.

While exemplary embodiments of the present invention have been described above, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:
1. A light-emitting device comprising:
   a resin package comprising:
      a lead part comprising a first lead and a second lead, each of the first lead and the second lead including a main body portion and at least one raised portion connected to the main body portion, wherein an upper surface of each of the first lead and the second lead includes a first primary surface portion in the main body portion and a curved surface portion in the at least one raised portion in a cross-sectional view taken in a direction perpendicular to an upper surface of the lead part, and wherein the curved surface portion is continuous with and curved upward from an end portion of the first primary surface portion,
      a resin portion, and
      a recess defined by a portion of the upper surface of the lead part and the resin portion; and
   a light-emitting element mounted in the resin package, wherein a part of each first primary surface portion is located at a bottom of the recess, wherein the light-emitting element is located on the first primary surface portion of at least the first lead in the recess, wherein each curved surface portion is buried in the resin portion, wherein the resin package includes a first outer lateral surface, a second outer lateral surface opposite to the first outer lateral surface, a third outer lateral surface, and a fourth outer lateral surface opposite to the third outer lateral surface, and wherein at at least one of the outer lateral surfaces, a surface of a corresponding raised portion is exposed from the resin portion and is substantially coplanar with a surface of the resin portion at said at least one of the outer lateral surfaces.

2. The light-emitting device according to claim 1, wherein the first lead and the second lead are both exposed from the resin portion at a bottom surface of the resin package.

3. The light-emitting device according to claim 1, wherein:
at each of the outer lateral surfaces, a surface of a corresponding raised portion is exposed from the resin portion and is substantially coplanar with a surface of the resin portion at the respective outer lateral surface.

4. The light-emitting device according to claim 3, wherein a height of the raised portion at the first outer lateral surface is different from a height of the raised portion at the third outer lateral surface.

5. The light-emitting device according to claim 3, wherein a width of the raised portion at the first outer lateral surface in a direction along the first outer lateral surface is different from a width of the raised portion at the third outer lateral surface in a direction along the third outer lateral surface.

6. The light-emitting device according to claim 1, wherein:
the lead part comprises a metal layer at each of an upper surface and a lower surface of the lead part, and
a thickness of the metal layer at the lower surface is smaller than a thickness of the metal layer at the upper surface.

7. The light-emitting device according to claim 1, wherein at said at least one of the outer lateral surfaces, the surface of the corresponding raised portion that is exposed from the resin portion is entirely surrounded by the surface of the resin portion.

* * * * *

UNITED STATES PATENT AND TRADEMARK OFFICE
CERTIFICATE OF CORRECTION

PATENT NO. : 10,622,528 B2
APPLICATION NO. : 15/924079
DATED : April 14, 2020
INVENTOR(S) : Oku et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 185 days.

Signed and Sealed this
Thirty-first Day of January, 2023

Katherine Kelly Vidal
*Director of the United States Patent and Trademark Office*